US005327021A

United States Patent [19]

Kanai et al.

[11] Patent Number: 5,327,021

[45] Date of Patent: Jul. 5, 1994

[54] WAVEFORM SYNTHESIZING CIRCUIT

[75] Inventors: Yasunori Kanai; Toshizi Shimada; Takahiko Nakao, all of Nagano; Yoshio Watanabe, Kawasaki, all of Japan

[73] Assignees: Shinko Electric Ind., Co., Ltd., Nagano; Fujitsu Ltd., Kawasaki, both of Japan

[21] Appl. No.: 895,901

[22] Filed: Jun. 9, 1992

[30] Foreign Application Priority Data

Jun. 10, 1991 [JP] Japan .................................. 3-164973

[51] Int. Cl.[5] .............................................. H03K 5/24

[52] U.S. Cl. .................................... 307/360; 307/608; 307/529; 307/494; 328/147; 328/156

[58] Field of Search ............... 307/529, 360, 361, 608, 307/358, 496; 328/146, 147, 156, 157, 158

[56] References Cited

U.S. PATENT DOCUMENTS

| | | | |
|---|---|---|---|
| 4,014,238 | 3/1977 | Southard | 307/529 |
| 4,092,550 | 5/1978 | Lauffer | 302/360 |
| 4,797,586 | 1/1989 | Traa | 307/603 |
| 4,870,367 | 9/1989 | Nakase et al. | 307/358 |
| 4,890,016 | 12/1989 | Tanaka et al. | 307/443 |
| 5,115,152 | 5/1992 | Nishimura | 307/358 |
| 5,144,174 | 9/1992 | Murakami | 307/608 |
| 5,151,625 | 9/1992 | Zaabadi et al. | 307/529 |
| 5,191,234 | 3/1993 | Murakami et al. | 307/265 |

FOREIGN PATENT DOCUMENTS

| | | |
|---|---|---|
| 0199374 | 10/1986 | European Pat. Off. . |
| 0455572 | 11/1991 | European Pat. Off. . |
| 54-61863 | 5/1979 | Japan . |
| 54-82154 | 6/1979 | Japan . |
| 60-80347 | 5/1985 | Japan . |
| 60-86911 | 5/1985 | Japan . |
| 62-189674 | 8/1987 | Japan . |

*Primary Examiner*—Timothy P. Callahan
*Assistant Examiner*—Dinh Le
*Attorney, Agent, or Firm*—Michael N. Meller

[57] ABSTRACT

A waveform synthesizing circuit comprises a plurality of signal output switching means for outputting predetermined magnitudes of voltage or current signals when a voltage or current value of an input pulse reaches preliminarily assigned comparing reference values, a signal summing means for superimposing output signals from a plurality of signal output switching means for summing, and a comparing signal switching means detecting the rising and falling of the input pulse, providing the comparing reference values with given differences between a plurality of signal output switching means according to an order of operation of a plurality of signal output switching means upon the detection of a rise, and providing the comparing reference values, which are different from those for rising, with given differences between a plurality of signal output switching means according to an order of operation of a plurality of signal output switching means upon the detection of a fall.

9 Claims, 8 Drawing Sheets

41
35
VREF
IN 1
VCS
VEE
42
43
44
CURRENT SUBTRACTION CIRCUIT
FIRST CURRENT AMPLIFIER
SECOND CURRENT AMPLIFIER

12
OUT
18
R1
17
Vre
23
22
R2
16
Vrd
R3
15
Vrc
R4
14
Vrb
R5
13
Vra
20
21
a
b
c
d
e
11
IN 1
19
VCS
VEE

OUT
12
40
29
30
VREF
33
R6
34
IN 2
37
38
36
39
R1
28
17
23
31
32
22
R2
R7
27
16
R3
R8
26
15
R4
R9
25
14
R5
R10
21
24
20
13
IN 1
11
19
VCS
VEE
a
b
c
d
e 41
42
43
44
CURRENT SUBTRACTION CIRCUIT
FIRST CURRENT AMPLIFIER
SECOND CURRENT AMPLIFIER
35
VREF
IN 1
VEE
VCS

WAVEFORM SYNTHESIZING CIRCUIT

BACKGROUND OF THE INVENTION

1. Field of the Invention

The present invention relates to a waveform synthesizing circuit. More specifically, the invention relates to a waveform synthesizing circuit to be employed in a transceiver or so forth for LAN (Local Area Network) for waveform shaping. Particularly, the invention relates to a waveform synthesizing circuit provided in parallel formation with a plurality of current switching circuits for outputting a predetermined magnitude of current when a voltage value reaches a preliminarily assigned comparing reference voltage, and output with superimposing currents output from a plurality of current switching circuits for summing.

2. Description of the Related Art

For establishing mutual communication between wordprocessors, personal computers or intelligent terminals installed within a relatively limited area, such as within a house or so forth, using a local area network system (LAN).

In FIG. 1, a basic construction of the Ethernet is illustrated as a typical example of a bus type LAN.

In FIG. 1, a coaxial cable 3 is used as a transmission cable. At both ends of the cable, 50 Ω of terminal resistors are provided for impedance matching. On the other hand, depending upon necessity, transceivers 2 are provided in the transmission path of the coaxial cable 3 for enabling communication with various terminals connected to the coaxial cable 3. To each transceiver 2, various terminals, such as a personal computer 6, a file server 5, printer 4 and so forth are connected, and mutual communication is performed between personal computers 6. Also, by the personal computers 6, the file server 5, the printer 4 or so forth are used in common. It should be noted that, in the case of Ethernet, a so-called CSMA/CD (carrier sense multiple access/collision detection) system is used to perform high speed communication with 50 ns or 100 ns of transmission pulse width employing a manchester code in the transmission signal.

For the circuit of the transceiver 2 connecting the terminal equipments 4 through 6 to the coaxial cable 3, the international standard IEEE 802.3 is applied to make the waveform of the pulse current waveform smooth by suppressing high harmonics so as to avoid noise on the transmission path and restrict degradation of the transmission waveform. In order to satisfy this requirement, a waveform synthesizing circuit is incorporated in the circuit of the transceiver 2.

One example of the conventional waveform synthesizing circuit is illustrated in FIG. 2. This circuit is provided with a plurality of current switching circuits (five, a through e in the shown embodiment) in parallel formation that output predetermined magnitudes of currents when the voltage value of an input pulse input to an input terminal (IN1) 11 reaches respective preliminarily assigned comparing reference voltages $V_{ra}$ through $V_{re}$. The currents output from respective plurality of current switching circuits (a) through (e) are superimposed for summing, and the summed current is output from an output terminal OUT 12 as the output current. For example, the comparing reference voltages $V_{ra}$ through $V_{re}$ provided for respective plurality of current switching circuits (a) through (e) are determined by a predetermined current of a constant current circuit comprising a voltage control setting terminal (VCS) 19, a transistor 20 and a resistor 21, voltage drops at breeder resistors R1 through R5 by the predetermined current, and forward voltages between bases and emitters of the emitter follower transistors 13 to 17, which serve as low impedance buffers. As an example of an assignment of the comparing reference voltage $V_{ra}$ through $V_{re}$, $V_{re}$ is a value $V_{re}=-5.95$ V determined by the summing of voltage drops at the resistor R1 for the base-emitter forward voltage of the transistor 18 and the base-emitter forward voltage of the emitter follower 17 from the ground potential. For subsequent reference voltages, by summing respective voltage drops at respective resistors R2 to R5, the reference voltages become $V_{rd}=-6.0$ V, $V_{rc}=-6.40$ V, $V_{rb}=-6.56$ and $V_{ra}=-6.70$ V.

Operation in this case will be discussed with reference to the current switching circuit (e). When the pulse voltage input to the input terminal IN1 drops below the potential of $V_{re}=-5.95$ V, an operational transistor 22 at IN1 side among operational transistors 22 and 23 of the current switching circuit e turns OFF, and the transistor 23, to which the $V_{re}$ is applied, turns ON to output (draw) current to the output terminal 12. Next, when the pulse voltage at the input IN1 reaches $V_{rd}=-6.08$, then the current switching circuit d becomes active so that both currents of the current switching circuits (d) and (e) are superimposed for summing to be output. Similarly, the currents of respective current switching circuits (c) to (a) are summed so that a synthesized waveform, in which output transition waveforms are synthesized in a stepwise fashion, is output. Subsequently, while the input pulse voltage is rising, the output transition waveforms are synthesized in a stepwise fashion in opposite order. Accordingly, the synthesized waveform, in which the pulse transition waveform is dulled during an input pulse voltage transition period (for example, passing period of Vra through Vrd) passing through respective comparing reference voltages $V_{ra}$ through $V_{re}$ in order. This output pulse is smoothed for the stepwise transition component by a simple low pass filter at the next stage. Therefore, the pulse waveform having a smooth transition configuration at the leading and trailing edge can be obtained.

However, the above-mentioned waveform synthesizing circuit has the following problem.

FIG. 3 shows an output current in the case that the above-mentioned waveform synthesizing circuit is employed.

FIG. 3(A) shows a waveform of the input pulse (t) at the input terminal IN1, FIG. 3(C) shows an ideal output current waveform of the waveform synthesizing circuit relative to the input pulse. As shown in FIG. 3(C), the waveform required is a symmetric waveform with smooth transition portions.

However, in practice, the waveform output from the conventional waveform synthesizing circuit is as illustrated in FIG. 3(B). In the case of this waveform, variation immediately after the rising and falling is sharp and asymmetric between left and right. Therefore, it cannot be said that the output waveform is satisfactorily shaped, because of the wiring capacity on the circuit board or the LSI chip or the output impedance of the output terminal OUT 12. When an attempt is made to reduce current consumption and make the circuit into LSI, the above-mentioned waveform (FIG. 3(B)) becomes more remarkable. In this case, a high harmonic component forming the abruptly varying portion is included in the output waveform to easily generate high harmonic noise in the transmission path. Therefore, the signal waveform propagating through the transmission path can be substantially degraded.

Therefore, in view of the above-mentioned problem, it is an object of the present invention to provide a waveform synthesizing circuit that is unaffected by the capacity of wiring or so forth, satisfies the requirements for reduction of power consumption, and provides smooth output current waveform and a high harmonic component with reduced magnitude.

SUMMARY OF THE INVENTION

In order to solve the above-mentioned problem, the inventor has concluded that the problem of insufficient waveform shaping resides in the set values of the comparing reference voltages $V_{ra}$ to $V_{re}$ assigned for respective current switching circuits (a) to (e). The present invention is attained based on similar setting of the comparing reference voltage assigned for respective switching circuits for the rise and fall of the input pulse.

Namely, according to the present invention, there is provided a waveform synthesizing circuit comprising a plurality of signal output switching means for outputting predetermined voltage magnitudes or current signals when a voltage or a current value of an input pulse attains preliminarily assigned comparing reference values, signal summing means for superimposing output signals from a plurality of the signal output switching means for summing, comparing signal switching means detecting the rise and fall of the input pulse, comparing reference values with given differences between a plurality of the signal output switching means according to the order of operation of a plurality of signal output switching means upon detecting rising, and comparing reference values that are different from those for rising, with given differences between a plurality of signal output switching means according to an order of operation of a plurality of signal output switching means upon the detection of a fall.

Also, according to the present invention, the comparing signal switching means has a delay means for inputting the pulse with a given delay period relative to the input pulse applied to a plurality of signal output switching means. The delay period given by the delay means is longer than or equal to a rising or falling period of the input pulse.

Furthermore, according to the present invention, the given difference of the comparing reference values from the comparing signal switching means is provided so that the greater difference is provided near the initiation of a transition of a rising or falling of the input signal and a smaller difference is provided near the end of said transition. The differences of the comparing reference values are set by a resistor voltage divider circuit, to which the reference voltage output from the comparing signal switching circuit is connected in series.

As set forth above, according to the present invention, since the comparing reference values output from the comparing signal switching means can be set independently for a rising and falling of the input pulse by adjusting the difference between comparing reference values, waveform shaping for a rising transition waveform and a falling transition waveform can be set independently of each other. By this, it becomes possible to perform a waveform shaping only for a falling transition waveform in the foregoing FIG. 3(B).

On the other hand, since the delay means provides the input pulse signal to the comparing signal switching means with a delay longer than or equal to the rising and falling period of the input pulse signal applied to a plurality of signal output switching circuits, when the pulse signal is input to the comparing signal switching circuit, the waveform shaping for rising by respective signal output switching means with the initially set comparing reference values (for rising) is completed; subsequently the comparing reference values are switched into other values (for falling) by the input pulse, and returned to the initial values (for rising) after completion of waveform shaping for falling by respective signal output switching means. Therefore, for both a rise and fall of the input waveform, respective corresponding comparing reference values can be provided.

In addition, since the given difference of the comparing reference values from the comparing signal switching means is provided so that the greater difference is provided near the initiation of a transition of a rise or fall of the input signal and a smaller difference is provided near the end of said transition, the waveform at initiation of transition becomes smooth at a greater magnitude. This is particularly effective for waveform shaping for a falling transition waveform of the FIG. 3(B).

DESCRIPTION OF THE PREFERRED EMBODIMENT

Figure 1:
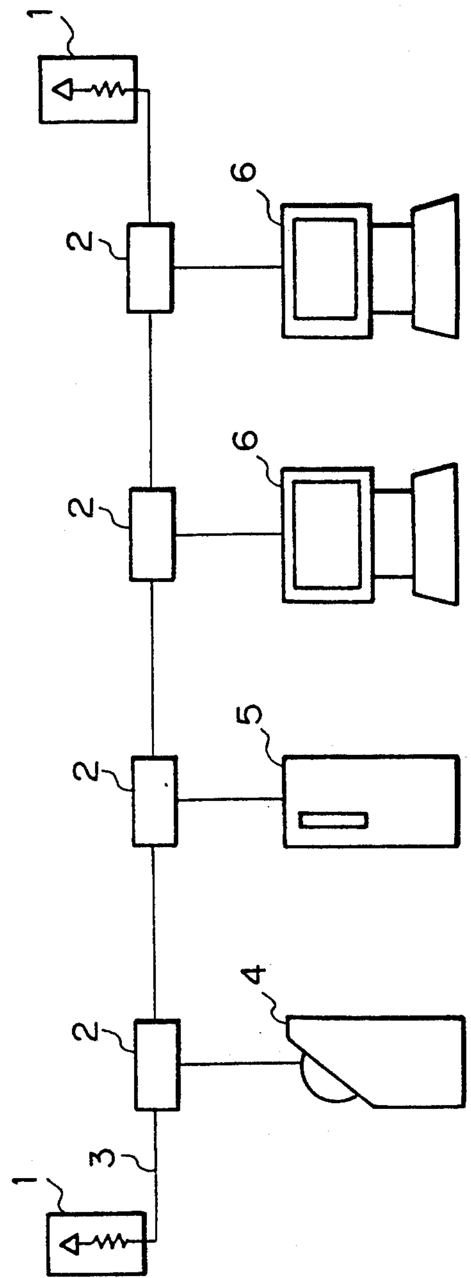
FIG. 1 is a diagrammatic illustration showing an example of a construction of a bus type LAN (Ethernet)
Figure 2:
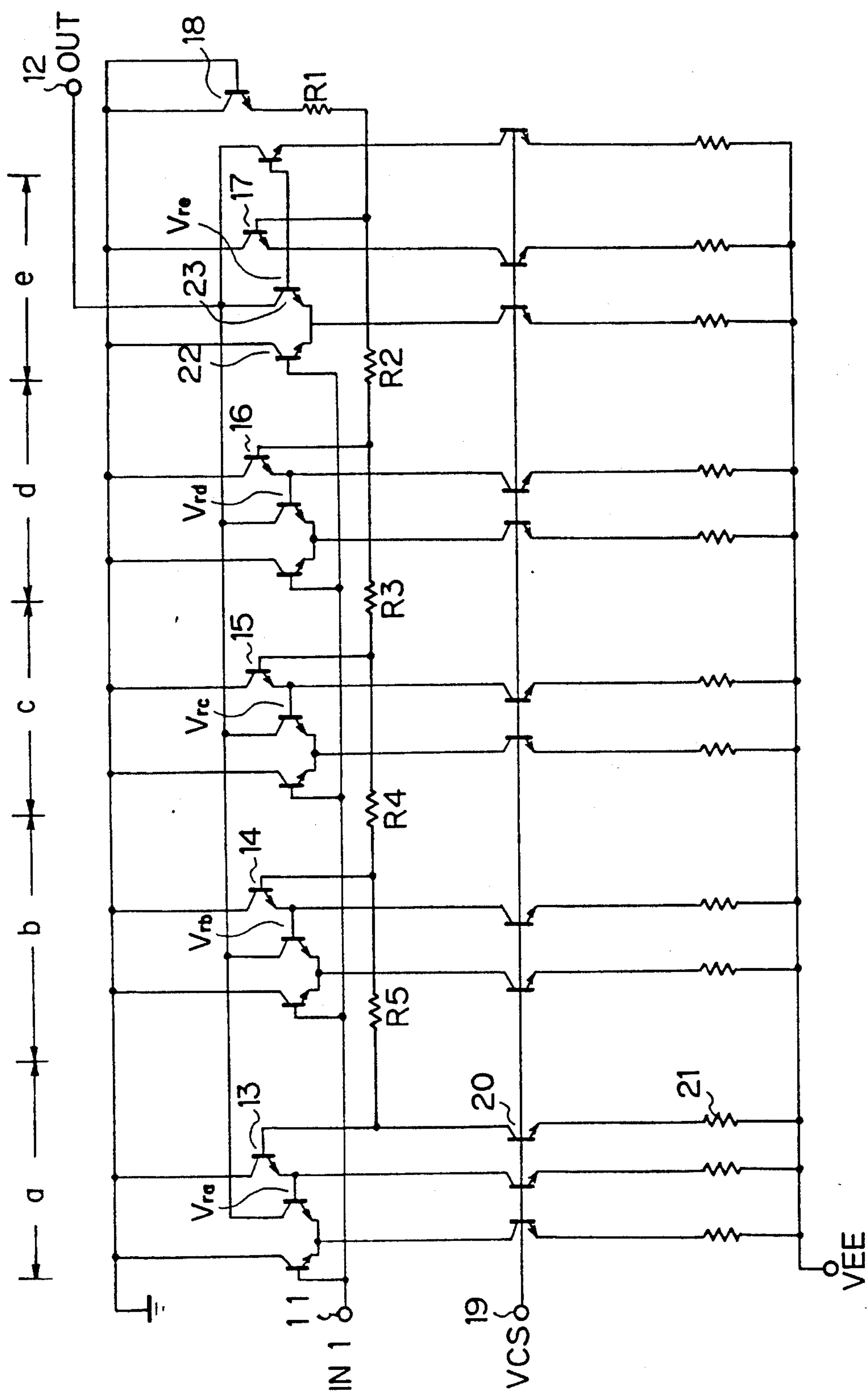
FIG. 2 is a circuit diagram showing one example of a waveform synthesizing circuit employing in the conventional transceiver.
Figure 4:
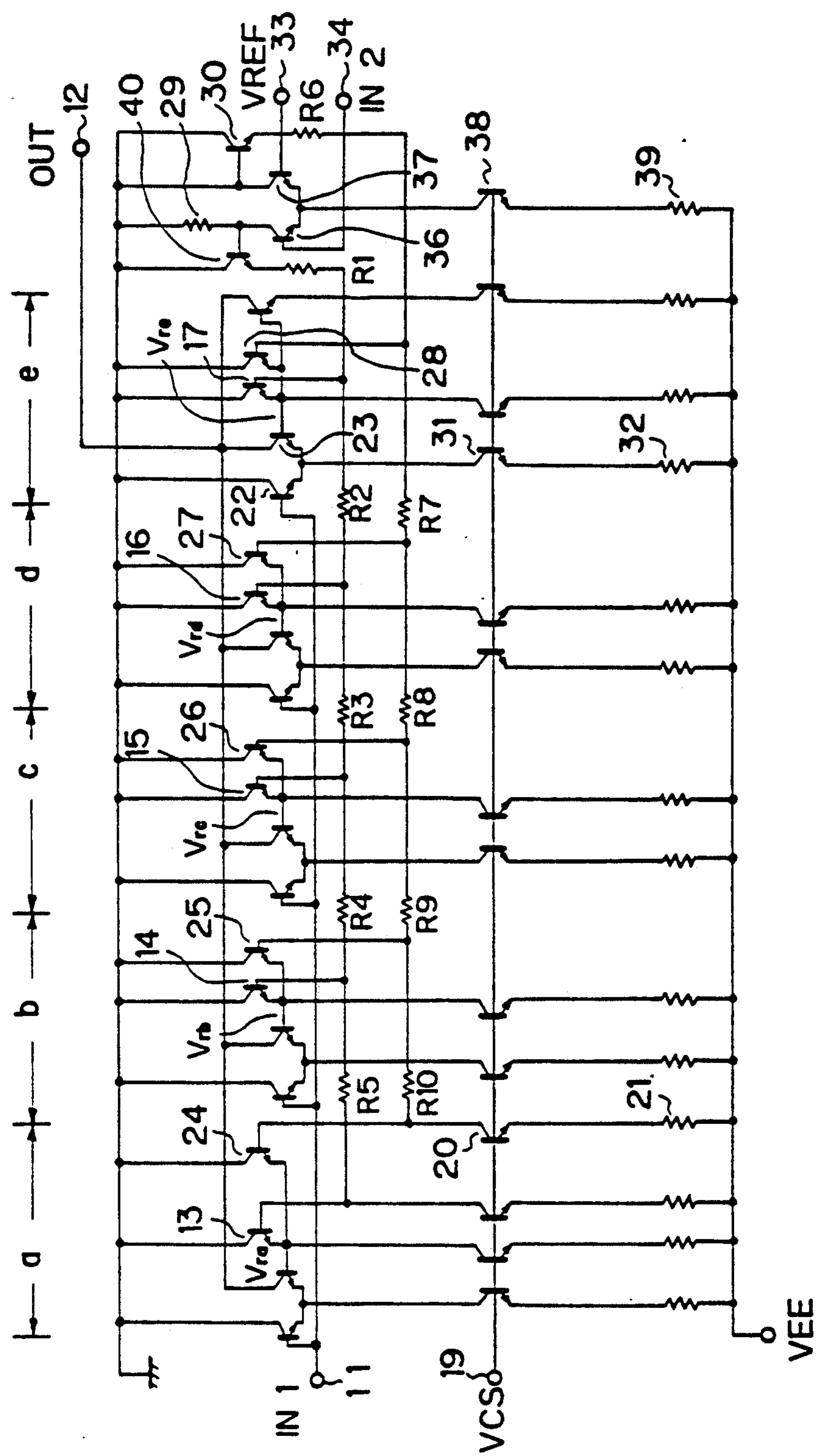
FIG. 4 is a circuit diagram showing one embodiment of a waveform synthesizing circuit according to the present invention.

FIG. 4 is a circuit diagram showing one embodiment of the waveform synthesizing circuit according to the present invention. The components similar to the foregoing prior art in FIG. 2 will be represented by the same reference numerals. It should be noted that, in the relationship between the present invention and the embodiment of FIG. 4, a signal output switching means corresponds to current switching circuits (a) to (e) of FIG. 4; signal summing means corresponds to collector multi-connection circuits of output transistors in the current switching circuits (a) to (e); a comparing signal switching means corresponds to a comparing signal switching circuit, resistor group for setting comparing reference values and a switching circuit for switching two comparing reference values, as illustrated on the right side of FIG. 4, which will be discussed later, and a delay means corresponds to a delay circuit of FIG. 6, which will be discussed later.

To the shown embodiment of the waveform synthesizing circuit of FIG. 4, the outputs of five current switching circuits (a) to (e), which are discussed with respect to the prior art (FIG. 2) and designed for an outputting current having a magnitude corresponding to the predetermined input voltage, are connected in parallel formation. The input pulse is input parallel to the current switching circuits (a) to (e) through an input terminal IN1.

Next, as a representative of the current switching circuits (a) to (e), discussion will be provided for the current switching circuit (e). The operational transistors 22 and 23 and transistor 31 and a resistor 32 connected to an emitter common terminal of the transistors 22 and 23 forms a constant current circuit and enables a high speed switching operation with a so-called ECL (emitter coupled logic). The input pulse is directly applied to the base of the transistor 22. On the base of the transistor 23, the comparing reference value, namely the comparing reference value $V_{re}$ discussed in the description for the prior art, is applied. By the operational switching transistors 22 and 23, comparison of the input pulse and the comparing reference value is performed. The point differentiated from the prior art is that the comparing reference voltage $V_{re}$ is provided by a diode switch circuit, to which the emitters of a transistor 17 and a transistor 28 are connected in multiconnection. For the bases of these transistors 17 and 28, respective one of the later-mentioned two comparing reference voltages are applied. One of the transistors provided a higher comparing reference voltage attains a forward direction and turn ON and provide the comparing reference voltage $V_{re}$.

To the base of the transistor 17, the resistor breeder circuit, which is discussed with reference to the prior art and formed by resistors R1, R2, R3, R4 and R5 is connected in series. On the other hand, to the base of the transistor 28, resistors R6, R7, RS, R9 and R10 performing a similar operation to the resistors R1 to R5, are connected in series. In the shown embodiment, the resistors R1 to R5 generate the comparing reference voltage (hereafter referred to as $V_{rer}$, for example, by adding r (rise)) to be used for a rising transition of the input pulse applied to the input terminal IN1. On the other hand, the registers R6 to R10 generate the comparing reference voltage (hereafter referred to as $V_{ref}$, for example, by adding f (fall)) to be used for a falling transition of the input pulse.

Figure 5:
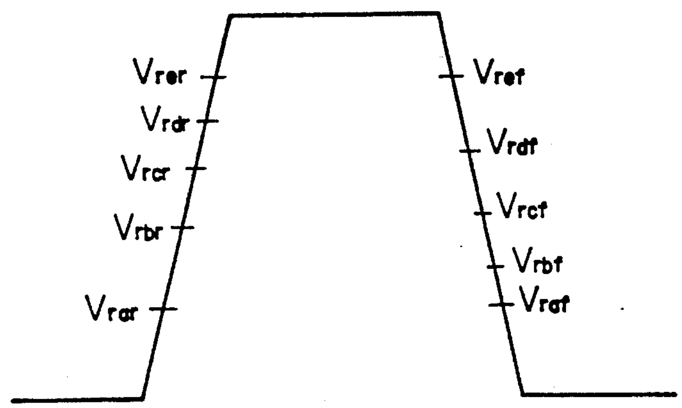
FIG. 5 is an explanatory illustration showing the relationship between the input pulse and comparing reference voltages.

FIG. 5 shows an example of the comparing reference voltages relative to the input pulse. In the shown embodiment, the respective values are set as follows:

(1) Rising of Input Pulse $V_{rer} = -5.950\ V$ $V_{rdr} = -6.055\ V$ $V_{rcr} = -6.220\ V$ $V_{rbr} = -6.430\ V$ $V_{rar} = -6.700\ V$ (2) Falling of Input Pulse $V_{ref} = -5.950\ V$ $V_{rdf} = -6.195\ V$ $V_{rcf} = -6.400\ V$ $V_{rbf} = -6.565\ V$ $V_{raf} = -6.700\ V$ For this, in the shown embodiment, the resistors R1 to R10 are set at the following values.

$R1 = 0.625\ K\Omega$ $R2 = 0.525\ K\Omega$ $R3 = 0.825\ K\Omega$ $R4 = 1.050\ K\Omega$ $R5 = 1.350\ K\Omega$ $R6 = 0.525\ K\Omega$ $R7 = 1.225\ K\Omega$ $R8 = 1.025\ K\Omega$ $R9 = 0.825\ K\Omega$ $R10 = 0.675\ K\Omega$ Next, discussion will be provided for a comparing signal switching circuit for switching two comparing reference voltages for rising and falling.

Figure 6:
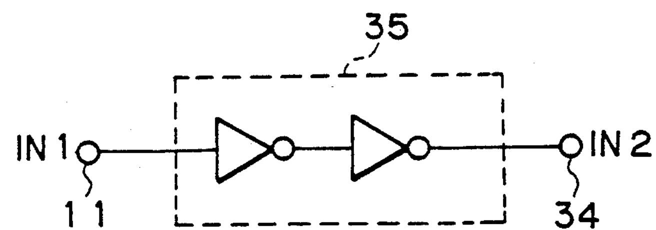
FIG. 6 is a circuit diagram showing one example of a delay circuit to be employed between terminals IN1 and IN2 of FIG. 4.

The voltage to be input to an input terminal (IN2) of the comparing signal switching circuit is the same pulse as the pulse input to the input terminal IN1 set forth above. As shown in FIG. 6, for a circuit connecting the input terminals IN1 and IN2, an appropriate delay circuit 35 is connected. It should be noted that FIG. 6 shows one example of the delay circuit 35 employing two inverters, but not specified thereto. By insertion of the delay circuit 35, the transition waveform of a rise and fall of the pulse input through the input terminal IN1 is provided to IN2 with a given delay. As shown, the comparing signal switching circuit has essentially the same circuit construction as the current switching circuits (a) to (e) set forth above and is formed by an ECL circuit of a constant-current circuit comprising operational switching transistors 36 and 37, a load transistor 38 and a resistor 39. For the base of one of the transistors 36 among the transistors 36 and 37, the delayed input pulse is applied from the IN2 terminal. On the base of the other transistor 37, a reference voltage VREF 33 to be compared with the voltage of the input pulse is applied. In the shown example, the comparing reference voltage at the side of the resistors R6 to R10 to which the forward direction voltage is applied, is fixed. In contrast, the comparing reference voltage at the side of the resistors R1 to R5 is variable depending upon the potential applied from a collector load resistor 29 of the switching transistor 36 through the emitter follower of a transistor 40.

Now, while no input is applied to the input terminal IN2, the transistor 36 is maintained at the OFF position. In this case, the comparing reference voltage at the side of the resistors R1 to R5 is set to be higher than the comparing reference voltage at the side of the resistor R6 to R10. Therefore, the comparing reference voltages $V_{rar}$ to $V_{rer}$ are supplied to the current switching circuit (a) to (e) through the switching transistors 13 to 17. Next, when the input pulse is applied, the transistor 36 is turned ON to lower the output voltage of the emitter follower transistor 40. Then, the potential of the comparing reference voltage at the side of the resistors R1 to R5 becomes lower than that of the comparing reference voltage at the side of the resistors R6 to R10. By this, the comparing voltages $V_{rar}$ to $V_{rer}$ are supplied to the current switching circuit (a) to (e) through the switching transistors 24 to 28.

The reference voltage VREF serving as a reference for the foregoing switching operation is set at a neutral position of the pulse voltage for detecting both the rise and fall of the input pulse. Accordingly, there is the possibility that the operation of the current switching circuit (a) to (e) having comparing reference voltages lower than the reference voltage VREF will become faster.

In order to solve this problem and assure the operation of the comparing signal switching circuit, the delay circuit 35 is inserted.

Figures 3A, 3B, 3C:
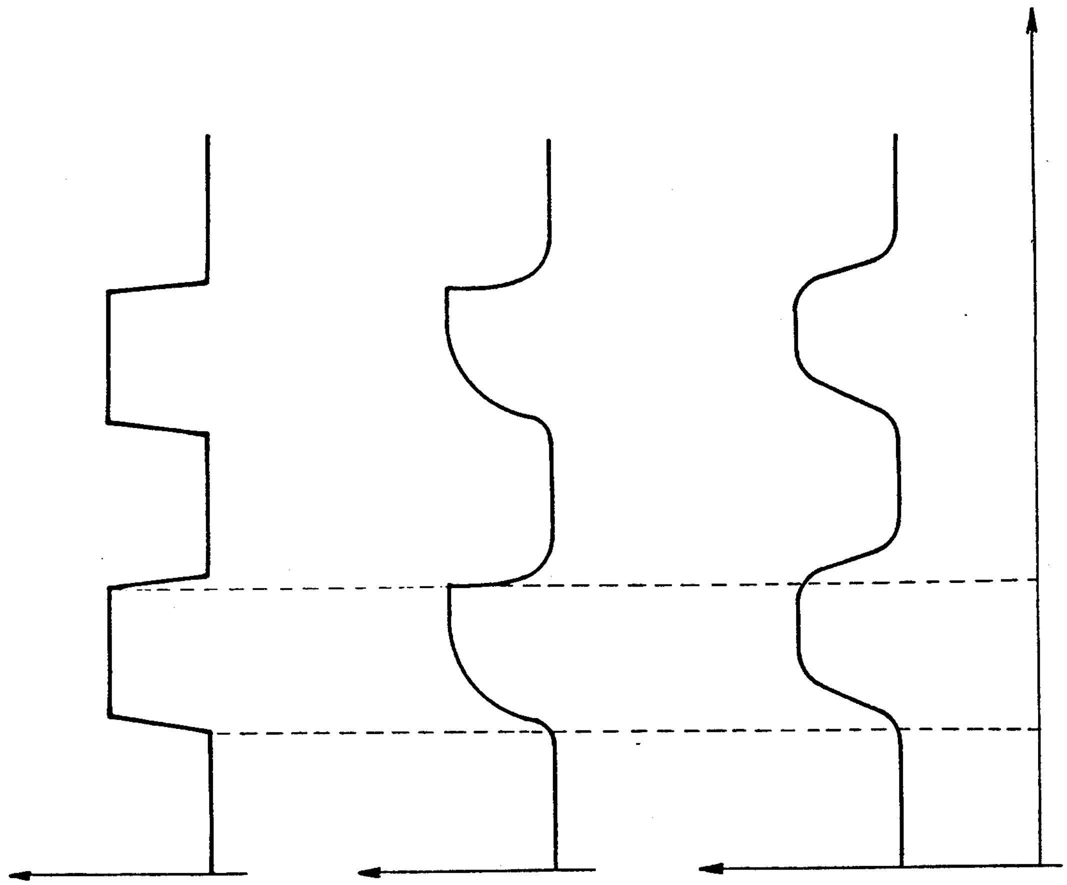
FIG. 3(A) is a chart showing an input pulse, current waveform through the conventional waveform synthesis.
FIG 3(B) is a chart showing an output pulse, current waveform through the conventional waveform synthesis.
FIG. 3(C) is chart showing the ideal current output waveform of the waveform synthesizing circuit.
Figure 7:
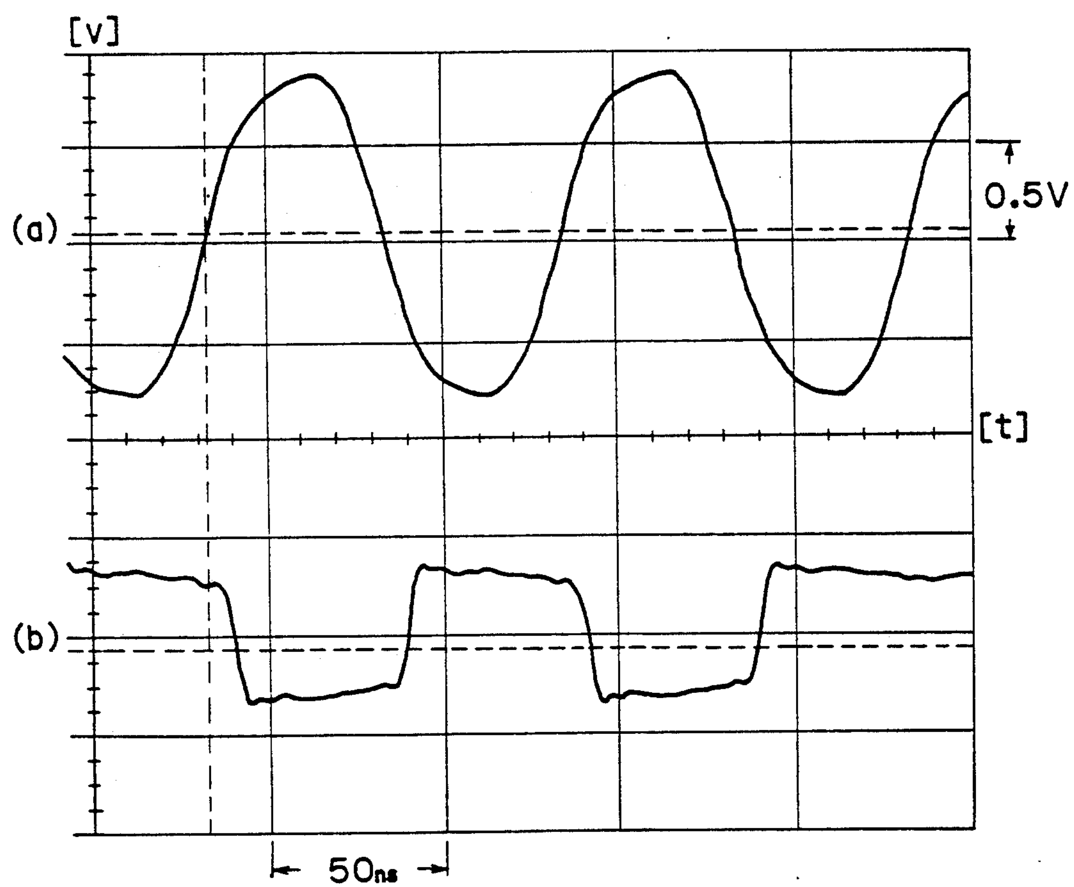
FIG. 7 is a chart showing the actual measurement of an output waveform of the waveform synthesizing circuit according to the present invention.

FIG. 7 shows an actually measured example of an output current waveform according to the present invention. In the figure, the lower waveform (b) shows the input waveform, and the upper waveform (a) is the output waveform obtained by a waveform synthesizing circuit according to the present invention. It should be noted, in the drawing, that the scale in the horizontal direction is 50 ns/div. and the scale in the vertical direction is 0.5 V/div. As set forth above, according to the present invention, the comparing reference voltages are set independently for rising and falling to thereby have a greater potential difference closer to the rising and falling edge when the voltage of the input pulse input to the input terminal IN1 is caused to vary rapidly. Therefore, as can be appreciated, the sharply varying portions are shaped into a smooth waveform. Accordingly, according to the present invention, it becomes possible for the output current waveform to approach the ideal current waveform as illustrated in FIG. 3(C). As a result, in comparison with the prior art, the high harmonic component has been significantly eliminated from the output current of the output terminal OUT, and distortion of the waveform is reduced.

Figure 8:
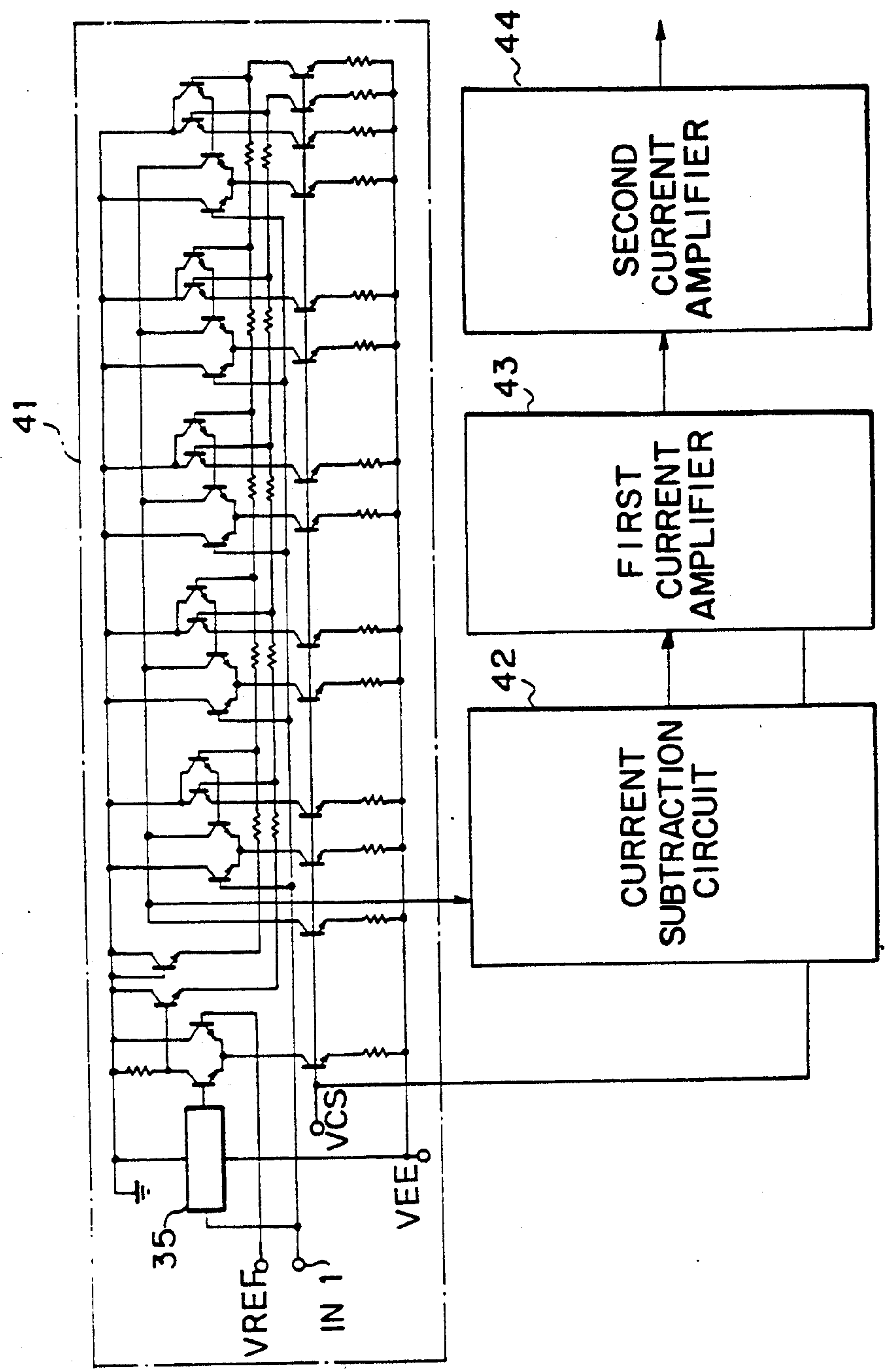
FIG. 8 is a circuit diagram of one example of a transmitter employing the waveform synthesizing circuit according to the present invention.

FIG. 8 shows one example of the transmitter circuit for LAN for connection between the coaxial cable and the terminal equipment by utilizing the waveform synthesizing circuit 41 according to the present invention.

Figure 9:
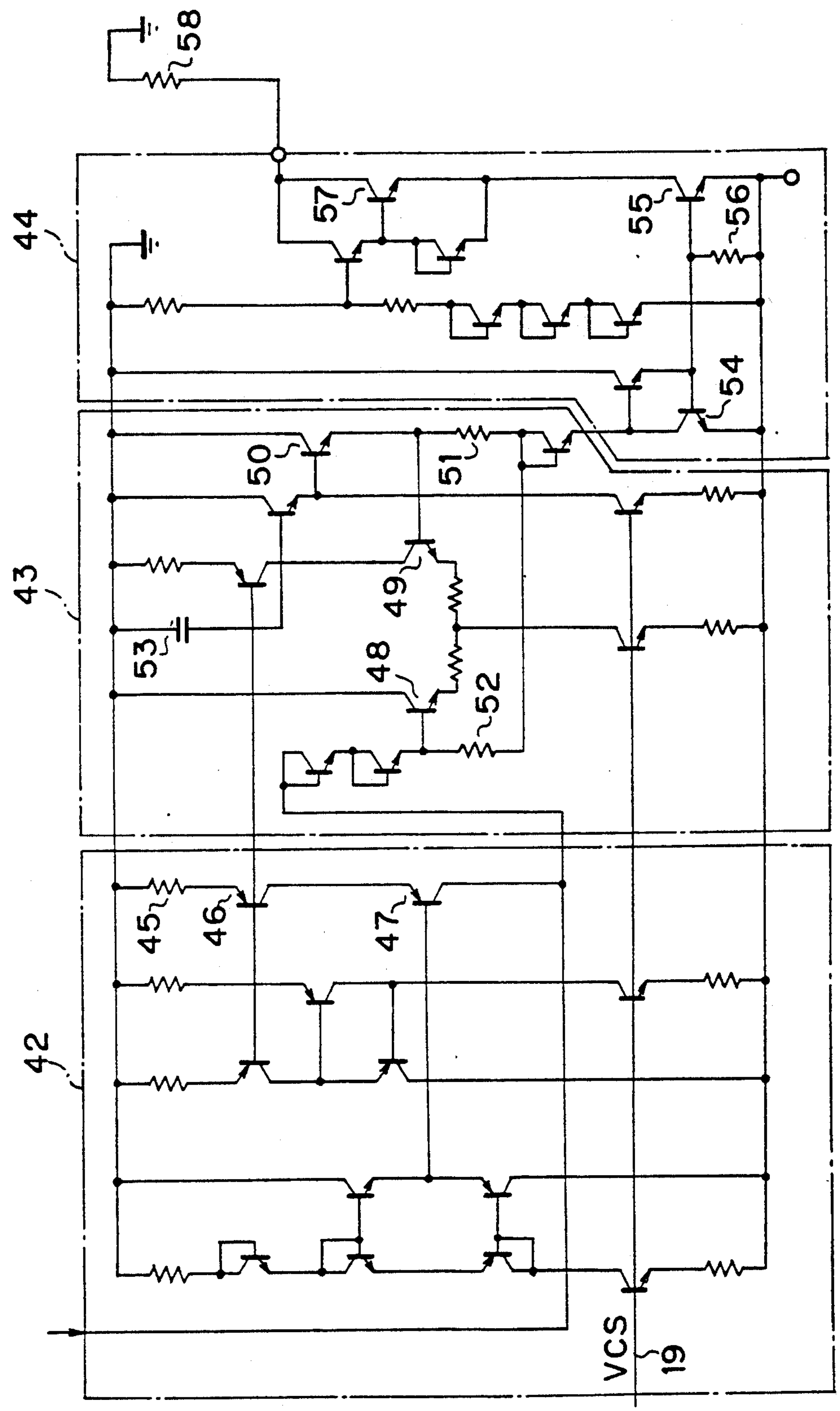
FIG. 9 is a circuit diagram showing one example of a current subtracting circuit and first and second stage amplifying circuits of FIG. 8.

In the circuit of FIG. 8, in addition to the waveform synthesizing circuit 41, a current subtraction circuit 42, a first current amplifier 43 and a second current amplifier 44 are used. The details of these components are illustrated in FIG. 9. Since the waveform synthesizing circuit 41 has already been discussed, here, discussion will be provided for the current subtraction circuit 42, the first current amplifier 43 and the second current amplifier 44 with reference to FIG. 9.

The current subtraction circuit 42 of FIG. 9 operates using an operation reference signal from a bias circuit formed at the left side and center portion with a plurality of transistors, resistors or so forth. The reference current for current subtraction is generated by a constant current circuit formed by a transistor 46 and a resistor 45. The reference current is output through a buffer transistor 47 that serves to reduce the mirror effect of the collector-base capacity of the transistor 46. A difference current obtained by subtracting the output current of the waveform synthesizing circuit 41 according to the present invention from the output current output from the buffer transistor 47 is input to the first current amplifying circuit 43 at the next stage. Accordingly, the current drawn by the waveform synthesizing circuit 41 becomes a phase inverted output current by the current subtraction circuit 42 and its level is converted into a predetermined level.

The first current amplifier 43 of FIG. 9 performs current amplification at a magnitude approximately 80 times in combination with the second current amplifying circuit 44, and serves to amplify the current 8 times. This current amplification stage performs a so-called differential amplifier type current amplification, and, the output of the first current amplification circuit 43 is input to the base input of a differential transistor 49 corresponding to an inverting input terminal among differential amplifiers 48 and 49. Furthermore, a resistor 51 is connected to the emitter of an output transistor 50. On the other hand, a resistor 52 is connected to a non-inverting input terminal. The other terminals of the resistors 51 and 52 are commonly connected to the second current amplifier 44 in the next stage. In this case, in the voltage follower, the voltage at the non-inverting input terminal and the inverting input terminal become equal to each other. Therefore, depending upon the resistance ratio of the resistors 51 and 52, the current amplification rate is determined. In this case, the resistance ratio, resistor 51: resistor 52 is set at 1:7 to perform an 8 times current amplification. On the other hand, a capacitor 53 of the differential amplifier is designed for a restricting band to prevent oscillation or so forth and equivalently serves as a low pass filter to remove the high harmonic component from the stepwise output current waveform of the waveform synthesizing circuit 41 to shape into a smooth waveform.

The second current amplification circuit 44 of FIG. 9 serves amplification the remaining 10 times, in relation to the first current amplifier 43. The output current of the first amplifier 43 is converted into a current in a drawing direction by a so-called current mirror circuit comprising transistors 54 and 55 and a resistor 56. Here, the transistors 54 and 55 are designed to have 1:10 of area ratio on a chip so that an output current that is 10 times that of the input current can flow. The final output stage is formed by NPN output transistor 57 in a Darlington connection. By this, a high impedance connection is made to the transfer cable. It should be noted that the resistor 58 is 25 Ω resistor equivalently representing 50 Ω of end resistors at both ends of the transmission cable.

Though discussion has been provided for the preferred embodiment of the present invention, the present invention should not be specified to the foregoing embodiments, and, of course, is possible to be modified in any way without departing from the spirit of the invention.

By employing the waveform synthesizing circuit according to the present invention, since the comparing reference voltages for rising and falling are set independently of each other, different waveform control immediately after rising and falling becomes possible. This enables smooth waveforms immediately after rising and falling and therefore, a waveform synthesizing circuit having a smooth output current waveform with lesser high harmonic distortion.

We claim:

1. A waveform synthesizing circuit comprising:

a plurality of output signal switching means for outputting predetermined magnitudes of voltage or current signals when a voltage or current value of an input pulse reaches respectively assigned comparing reference values;

signal summing means for superimposing output signals from a plurality of said switching means;

delay means for providing a delayed pulse with a predetermined delay period relative to said input pulse that is applied to a plurality of said switching means;

comparing reference means for providing said comparing reference values that consists of first references each of which is provided to a plurality of said switching means with given differences between a plurality of said switching means according to an order of operation of a plurality of said switching means for a rising period of said input pulse, and second references each of which is provided to said plurality of switching means with given differences between a plurality of said switching means according to an order to operation of a plurality of said switching means for a falling period of said input pulse; and comparing signal switching means for providing either said first references or said second references to a plurality of said output signal switching means, by deciding the outputting period of said delayed pulse from said delay means as said falling period of said input pulse and the other period as said rising period of said input pulse.

2. A waveform synthesizing circuit as set forth in claim 1, wherein said delay period given by said delay means is longer than or equal to a rising or falling period of said input pulse.

3. A waveform synthesizing circuit as set forth in claim 1 wherein said given difference of said comparing reference values from said comparing signal switching means is provided so that the greater difference is provided near the initiation of a transition of a rise or fall of said input signal and a smaller difference is provided near the end of said transition.

4. A waveform synthesizing circuit as set forth in claim 1, wherein said differences of said comparing reference values are set by a resistor voltage divider circuit, to which the reference voltage output from the comparing signal switching circuit is connected in series.

5. A transmitter circuit comprising:

a waveform synthesizing circuit comprising:

a plurality of switching means for outputting predetermined magnitudes of voltage or current signals when a voltage or current value of an input pulse reaches respectively assigned comparing reference values;

signal summing means for superimposing output signals from a plurality of said switching means;

delay means for providing a delayed pulse with a predetermined delay period relative to said input pulse that is applied to a plurality of said switching means;

comparing reference means for providing said comparing reference values that consists of first references each of which is provided to a plurality of said switching means with given differences between a plurality of said switching means according to an order of operation of a plurality of said switching means for a rising period of said input pulse, and second reference each of which is provided to said plurality of switching means with given differences between a plurality of said switching means according to an order of a plurality of said switching means for a falling period of said input pulse;

comparing signal switching means for providing either said first references or said second references to a plurality of said switching means, by deciding the outputting period of said delayed pulse from said delay means as said falling period of said input pulse and the other period as said rising period of said input pulse;

a converter circuit for level conversion of input and output signals by inverting a phase of the signal output from said waveform synthesizing circuit; and a current amplifying and outputting circuit for amplifying and outputting the output signal of said converter circuit at a given value line.

6. A transmitter circuit comprising:

a waveform synthesizing circuit comprising a plurality of switching means for outputting predetermined magnitudes of voltage or current signals when a voltage or current value of input pulse reaches preliminarily assigned comparing reference values;

signal summing means for superimposing output signals from a plurality of said switching means for summing;

comparing means for detecting the rising and falling of said input pulse, providing said comparing reference values with given differences between a plurality of said switching means according to an order of operation of a plurality of switching means upon the detection of a rise, and providing said comparing reference values, which are different from those for rising, with given differences between a plurality of said switching means according to an order of operation of a plurality of switching means upon the detection of a fall;

a converter circuit for level conversion of input and output signals by inverting a phase of the signal output from said waveform synthesizing circuit; and a current amplifying and outputting circuit for amplifying and outputting the output signal of said converter circuit at a given value wherein said converter circuit comprises a current subtraction circuit for outputting current output by subtracting the current output of said waveform synthesizing circuit from a predetermined current value.

7. A transmitter circuit comprising a waveform synthesizing circuit comprising:

a plurality of switching means for outputting predetermined magnitudes of voltage or current signals when a voltage or current value of input pulse reaches preliminarily assigned comparing reference values;

signal summing means for superimposing output signals from a plurality of said switching means for summing;

comparing means for detecting the rising and falling of said input pulse, providing said comparing reference values with given differences between a plurality of said switching means according to an order of operation of a plurality of switching means upon the detection of a rise, and providing said comparing reference values, which are different from those for rising, with given differences between a plurality of said switching means according to an order of operation of a plurality of switching means upon the detection of a fall;

a converter circuit for level conversion of input and output signals by inverting a phase of the signal output from said waveform synthesizing circuit; and a current amplifying and outputting circuit for amplifying and outputting the output signal of said converter circuit at a given value, wherein said amplifying and outputting circuit comprises an operational amplifier circuit, in which the current amplification ratio is determined by a resistance ratio and which functions as a low pass filter for removing a high harmonic component.

8. A transmitter circuit comprising a waveform synthesizing circuit comprising:

a plurality of switching means for outputting predetermined magnitudes of voltage or current signals when a voltage or current value of input pulse reaches preliminarily assigned comparing reference values;

signal summing means for superimposing output signals from a plurality of said switching means for summing;

comparing means for detecting the rising and falling of said input pulse, providing said comparing reference values with given differences between a plurality of said switching means according to an order of operation of a plurality of switching means upon the detection of a rise, and providing said comparing reference values, which are different from those for rising, with given differences between a plurality of said switching means according to an order of operation of a plurality of switching means upon the detection of a fall;

a converter circuit for level conversion of input and output signals by inverting a phase of the signal output from said waveform synthesizing circuit; and a current amplifying and outputting circuit for amplifying and outputting the output signal of said converter circuit at a given value, wherein said amplifying and outputting circuit comprises a current mirror current amplifying circuit for driving an output transistor.

9. A transmitter circuit comprising a waveform synthesizing circuit comprising:

a plurality of switching means for outputting predetermined magnitudes of voltage or current signals when a voltage or current value of input pulse reaches preliminarily assigned comparing reference values;

signal summing means for superimposing output signals from a plurality of said switching means for summing; and comparing means for detecting the rising and falling of said input pulse, providing said comparing reference values with given differences between a plurality of said switching means according to an order of operation of a plurality of switching means upon the detection of a rise, and providing said comparing reference values, which are different from those for rising, with given differences between a plurality of said switching means according to an order of operation of a plurality of switching means upon the detection of a fall;

a converter circuit for level conversion of input and output signals by inverting a phase of the signal output from said waveform synthesizing circuit; and a current amplifying and outputting circuit for amplifying and outputting the output signal of said converter circuit at a given value, wherein said amplifying and outputting circuit has an operational current amplification stage at the front stage, in which the current amplification ratio is determined by a resistance ratio and functions as a low pass filter for removing a high harmonic component, and a mirror current amplification stage for driving an output transistor.

* * * * *